(12) United States Patent
Jeong

(10) Patent No.: US 10,768,883 B2
(45) Date of Patent: Sep. 8, 2020

(54) DISPLAY PANEL AND MULTI DISPLAY DEVICE HAVING AT LEAST DISPLAY PANELS INCLUDING A TRANSPARENT REGION IN A NON-DISPLAY REGION

(71) Applicant: LG DISPLAY CO., LTD., Seoul (KR)

(72) Inventor: Il-Gi Jeong, Cheongwon-gun (KR)

(73) Assignee: LG DISPLAY CO., LTD., Seoul (KR)

(*) Notice: Subject to any disclaimer, the term of this patent is extended or adjusted under 35 U.S.C. 154(b) by 37 days.

(21) Appl. No.: 15/218,863

(22) Filed: Jul. 25, 2016

(65) Prior Publication Data

US 2017/0031643 A1   Feb. 2, 2017

(30) Foreign Application Priority Data

Jul. 31, 2015   (KR) .................. 10-2015-0108813

(51) Int. Cl.
| | | |
|---|---|---|
| *G06F 3/14* | (2006.01) | |
| *G09G 3/3225* | (2016.01) | |
| *G06F 1/16* | (2006.01) | |
| *H01L 27/32* | (2006.01) | |
| *G09G 3/36* | (2006.01) | |

(52) U.S. Cl.
CPC .......... *G06F 3/1446* (2013.01); *G06F 1/1647* (2013.01); *G09G 3/3225* (2013.01); *H01L 27/3293* (2013.01); *G09G 3/3648* (2013.01); *G09G 2300/026* (2013.01); *G09G 2300/04* (2013.01); *G09G 2300/043* (2013.01)

(58) Field of Classification Search
CPC ................ G06F 1/1647; G06F 3/1446; G09G 2300/026; G09G 2300/04; G09G 2300/043; G09G 3/3225; G09G 3/3648; H01L 27/3267
See application file for complete search history.

(56) References Cited

U.S. PATENT DOCUMENTS

| | | | | |
|---|---|---|---|---|
| 8,760,365 B2* | 6/2014 | Lee | .......................... | G09G 3/20 |
| | | | | 345/1.1 |
| 8,952,876 B2* | 2/2015 | Kim | ...................... | G02F 1/1362 |
| | | | | 257/59 |
| 2005/0285811 A1* | 12/2005 | Kawase | .............. | G02F 1/13336 |
| | | | | 345/1.1 |

(Continued)

FOREIGN PATENT DOCUMENTS

| | | |
|---|---|---|
| CN | 101750822 A | 6/2010 |
| CN | 102540560 A | 7/2012 |

(Continued)

*Primary Examiner* — Ram A Mistry

(74) *Attorney, Agent, or Firm* — Birch, Stewart, Kolasch & Birch, LLP

(57) ABSTRACT

A multi display device can include a first display panel including a display region having a plurality of pixels for displaying an image and a non-display region at a periphery of the display region; and a second display panel including a display region having a plurality of pixels for displaying an image and a non-display region at the periphery of the display region of the second display panel, wherein a portion of the non-display region of the first display panel includes a transparent region, wherein the second display panel is disposed such that a portion of the display region of the second display panel overlaps the transparent region of the non-display region of the first display panel.

30 Claims, 16 Drawing Sheets

(56) References Cited

U.S. PATENT DOCUMENTS

| | | | |
|---|---|---|---|
| 2006/0197718 A1* | 9/2006 | Yamate | H05K 1/148 345/37 |
| 2011/0199345 A1* | 8/2011 | Yoshino | G02F 1/136286 345/204 |
| 2012/0169578 A1* | 7/2012 | Kim | G09G 3/3688 345/93 |
| 2013/0271408 A1* | 10/2013 | Xie | G06F 3/044 345/173 |
| 2014/0049453 A1* | 2/2014 | Lee | G09G 3/20 345/55 |

FOREIGN PATENT DOCUMENTS

| | | |
|---|---|---|
| CN | 103282955 A | 9/2013 |
| CN | 204348297 U | 5/2015 |

* cited by examiner

DISPLAY PANEL AND MULTI DISPLAY DEVICE HAVING AT LEAST DISPLAY PANELS INCLUDING A TRANSPARENT REGION IN A NON-DISPLAY REGION

CROSS-REFERENCE TO RELATED APPLICATIONS

This application claims the priority benefit under 35 U.S.C. § 119(a) of Korean Patent Application No. 10-2015-0108813, filed on Jul. 31, 2015, in the Korean Intellectual Property Office, which is incorporated herein by reference in its entirety.

BACKGROUND OF THE INVENTION

Technical Field

The present disclosure relates to a display device, and more particularly, to a display panel including a display region and a non-display region and a multi display device including the display panel.

Discussion of the Related Art

Recently, various display device such as a liquid crystal display (LCD) device, a plasma display panel (PDP) and an organic light emitting diode (OLED) display device have been developed as a device for displaying an image. The various display devices have been used for various products such as a smart phone, a notebook, a television and a tablet personal computer (PC).

However, when the display device is implemented in a public institution for displaying an image to many people, a display device of a large size is required. Although the display technology has been developed, it is still hard to fabricate a single display device having a size greater than about 100 inches because of a fabrication process.

As a result, a multi display device including a plurality of display panels has been suggested for a large size. Since a plurality of display panels or display devices are combined to constitute a large-sized single image in the multi display device, the multi display device may be applied to a public institution with various methods.

FIG. 1 is a plan view showing a multi display device including two display panels according to the related art.

In FIG. 1, the multi display device according to the related art includes a first display panel 10 at one side (left side) and a second display panel 20 at another side (right side).

Although a plurality of display panels are disposed adjacent to each other, each of the first and second display panels 10 and 20 has an individual non-display region A. As a result, a user viewing an image may recognize a total non-display region B greater than the individual non-display region A between the first and second display panels 10 and 20.

Accordingly, the total non-display region B of the multi display device according to the related art in a public place may be recognized as an unpleasant portion to a user viewing an image, and a user may not be able to view a perfect or good image due to a border line between images.

Recently, the total non-display region between the display panels or the display devices has been reduced due to various efforts and various technologies. However, since the individual non-display region in the related art multi display device is essential for supplying an image signal and a power to a display region and conductive lines are formed in the individual non-display region, reducing the individual non-display region is substantially limited.

SUMMARY OF THE INVENTION

Embodiments of the present disclosure relate to a display panel and a multi display device using the same that substantially obviates one or more of the problems due to limitations and disadvantages of the related art.

One embodiment is a multi display device where a total non-display region between display panels is removed and an image is displayed even by the total non-display region.

One embodiment is a multi display device including at least two display panels where a total non-display region between the two adjacent display panels becomes transparent and a perfect image without a border line is displayed.

One embodiment is a multi display device including at least two display panels where a step difference due to the two adjacent display panels is mitigated by a step difference controlling portion or where a portion of a total non-display region is removed to form a chamfer.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment is a multi display device including: a first display panel including a display region having a plurality of pixels for displaying an image and a non-display region at a periphery of the display region; and a second display panel including a display region having a plurality of pixels for displaying an image and a non-display region at a periphery of the display region of the second display panel, wherein a portion of the non-display region of the first display panel includes a transparent region, and wherein the second display panel is disposed such that a portion of the display region of the second display panel overlaps the transparent region of the non-display region of the first display panel.

In another aspect, another embodiment is a display device including: a display panel including a display region having a plurality of pixels for displaying an image and a non-display region at a periphery of the display region; a gate driver configured to supply a gate signal to the display region; and a data driver configured to supply a data signal to the display region, wherein the non-display region of the display panel includes a plurality of conductive lines, and wherein a portion of the non-display region includes a transparent region.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION OF THE EMBODIMENTS

Figure 1:
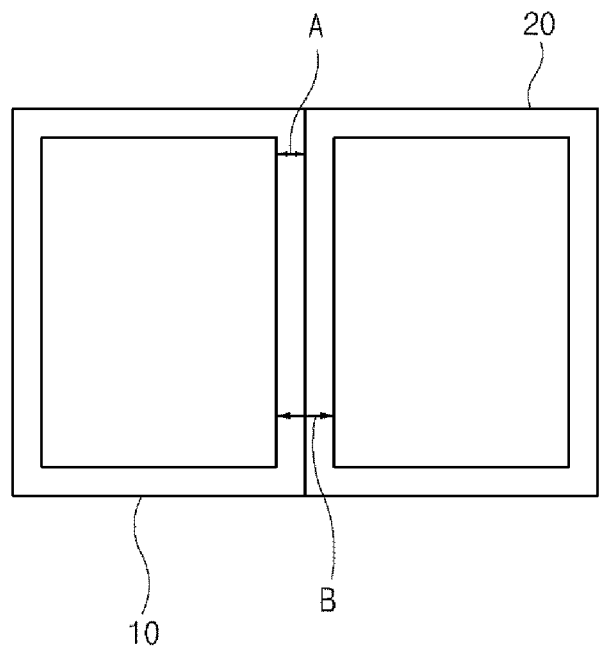
FIG. 1 is a plan view showing a multi display device including two display panels according to the related art.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
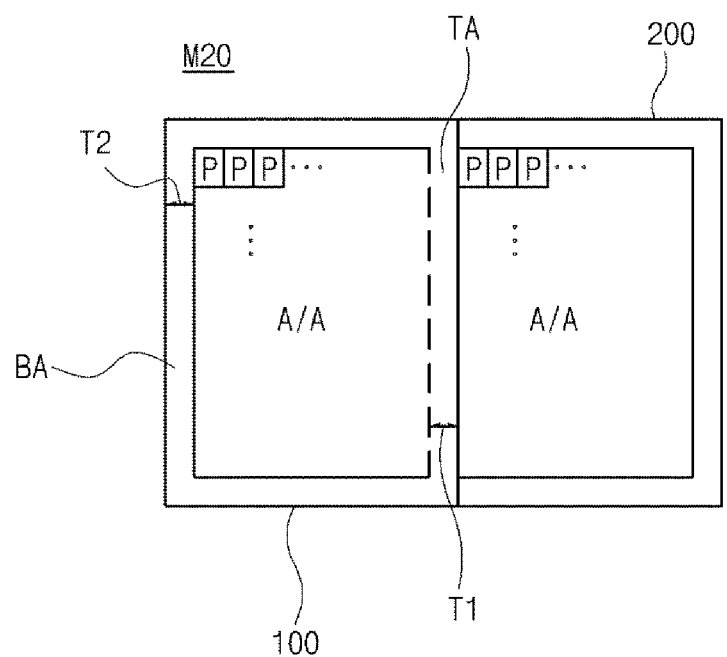
FIG. 2 is a plan view showing a multi display device according to an embodiment of the present disclosure.

FIG. 2 is a plan view showing a multi display device according to an embodiment of the present disclosure. All the components of the multi display device according to all embodiments of the present disclosure are operatively coupled and configured.

In FIG. 2, the multi display device according to the embodiment of the present disclosure includes a first display panel 100 and a second display panel 200.

The first display panel 100 includes a display region A/A including a plurality of pixels P for displaying an image at a central portion thereof and a non-display region BA at a periphery of the display region A/A. Similarly, the second display panel 200 includes a display region A/A including a plurality of pixels P for displaying an image at a central portion thereof and a non-display region BA at a periphery of the display region A/A. The non-display region BA of the first display panel 100 may have a width of a second distance T2.

A portion of the non-display region BA of the first display panel 100 may include a transparent region TA. The transparent region TA of the non-display region BA of the first display panel 100 adjacent to the display region A/A of the second display panel 200 is formed to be transparent. Since the transparent region TA of the non-display region BA is disposed to overlap the display region A/A of the second display panel 200, a central portion of the display device according to the embodiment of the present disclosure may be recognized to have no non-display region BA. The transparent region TA may have a width of a first distance T1. The first distance T1 of the transparent region TA may be the same as the second distance T2 of the non-display region BA. Alternatively, the first distance T1 of the transparent region TA may be greater than or smaller than the second distance T2 of the non-display region BA according to design property of the first and second display panels 100 and 200.

In the display panel and the multi display device according to the embodiment of the present disclosure, a portion of the non-display region BA may include the transparent region TA. The transparent region TA may not be limited to a transparency of 100%. For example, the transparent region TA may have a transparency of about 90% or a transparency of about 50%. Alternatively, the transparent region TA may have a transparency smaller than about 50%. As a result, the transparent region TA of the display panel and the multi display device according to an embodiment of the present disclosure may have an optimum transparency.

In the display panel and the multi display device according to the embodiment of the present disclosure, the non-display region BA may include an opaque portion. The opaque portion is not limited to an opaqueness of 100%. For example, the opaque portion may have an opaqueness of about 80% or an opaqueness of about 60%. As a result, the opaque portion of the display panel and the multi display device according to an embodiment of the present disclosure may have an optimum opaqueness.

Figure 3:
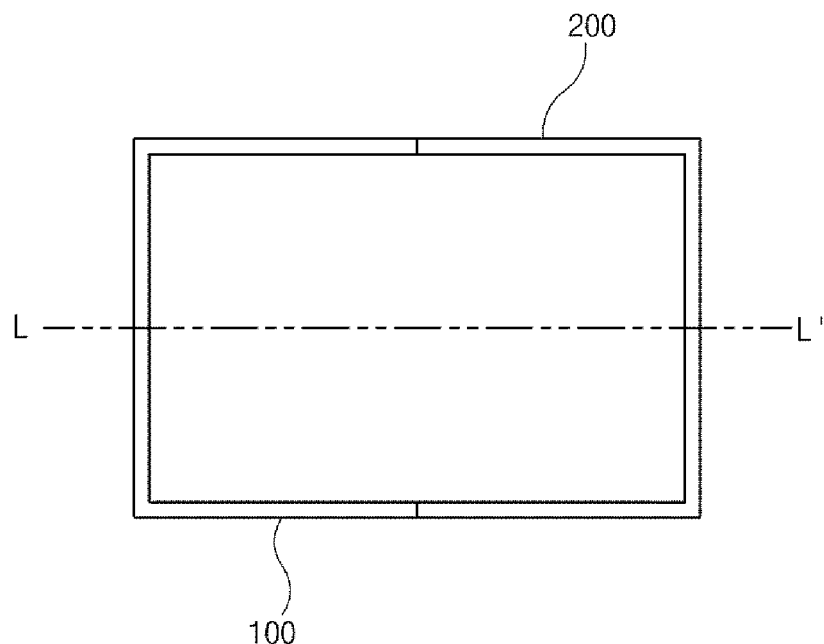
FIG. 3 is a plan view showing a multi display device according to an embodiment of the present disclosure.

FIG. 3 is a plan view showing a multi display device according to an embodiment of the present disclosure.

In FIG. 3, since the transparent region TA of the non-display region BA at a central portion between the first and second display panels 100 and 200 is not recognized, the multi display device according to the embodiment of the present disclosure may display a perfect or good image without a border line.

Figure 4:
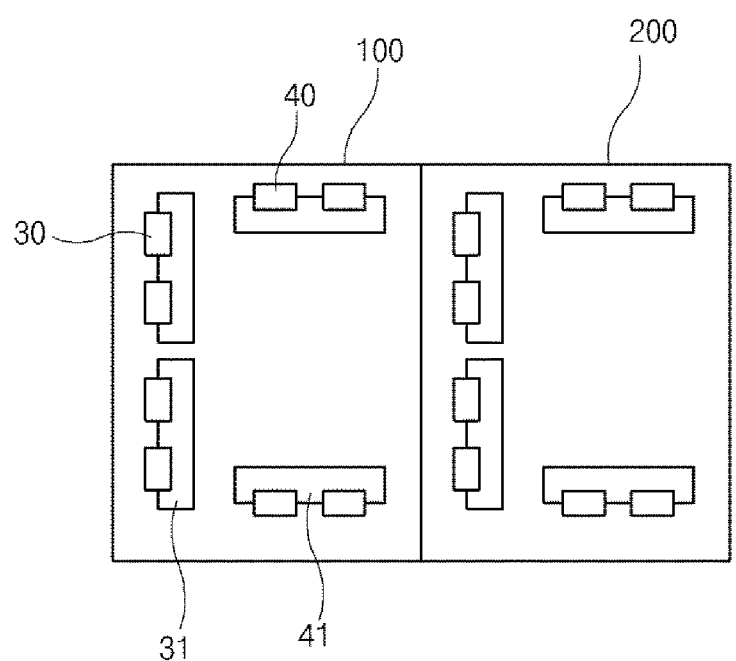
FIG. 4 is a plan view showing a rear surface of a multi display device according to an embodiment of the present disclosure.

FIG. 4 is a plan view showing a rear surface of a multi display device according to an embodiment of the present disclosure.

In FIG. 4, first and second driving units for driving the first and second display panels 100 and 200 are disposed on a rear surface of the multi display device. The first and second driving units may have similar structures. The first driving unit may include a gate driver 40, a gate printed circuit board (PCB) 41, a data driver 30 and a data PCB 31. The gate driver 40 and the gate PCB 41 may be disposed at upper and lower portions of the rear surface of the first display panel 100 and the data driver 30 and the data PCB 31 may be disposed at a left portion of the ear surface of the first display panel 100. The gate driver 40 and the data driver 30 may be disposed at various portions with various numbers. For example, the gate driver 40 may be disposed at left and right portions or at one side portion of the rear surface of the first display panel 100. Alternatively, the gate driver 40 may be integrated in the first display panel 100 by a gate-in-panel (GIP) technology. Similarly, the data driver 30 may be disposed at upper and lower portions or at one side portion of the rear surface of the first display panel 100.

The first display panel 100 may further include a timing controller. The timing controller may output a plurality of control signals such as a data control signal (DCS) and a gate control signal (GCS) for controlling the data driver 30 and the gate driver 40. According to a control of the timing controller, the gate driver 40 may sequentially supply a scan signal of an ON voltage and an OFF voltage to the first to nth gate lines GL1 to GLn to drive the first to nth gate lines GL1 to GLn sequentially. According to a control of the timing controller, the data driver 30 may store an inputted image data in a memory and may supply a data voltage of an analog type converted from the image data to first to mth data lines DL1 to DLm when a gate line is selected to drive the first to mth data lines DL1 to DLm.

Figure 5:
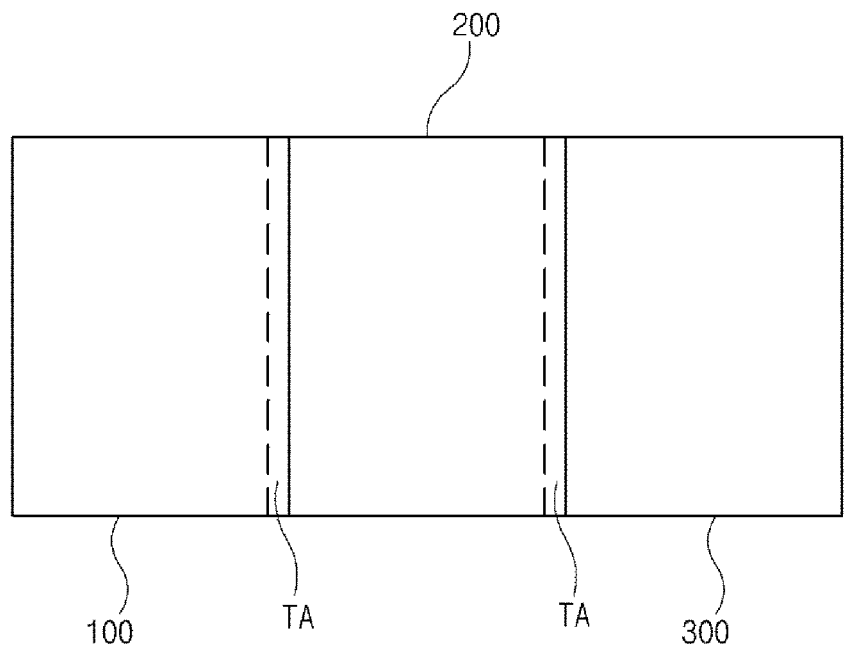
FIG. 5 is a plan view showing a multi display device according to an embodiment of the present disclosure.

FIG. 5 is a plan view showing a multi display device according to an embodiment of the present disclosure.

In FIG. 5, a multi display device according to the embodiment of the present disclosure includes first, second and third display panels 100, 200 and 300. A transparent region TA of a non-display region of the first display panel 100 is disposed to overlap a portion of a display region of the second display panel 200, and a transparent region TA of a non-display region of the second display panel 200 is disposed to overlap a portion of a display region of the third display panel 300. As a result, the multi display device according to the embodiment of the present disclosure may display a perfect image without a border line. A portion of a non-display region of the third display panel 300 may include a transparent region TA.

Figure 6:
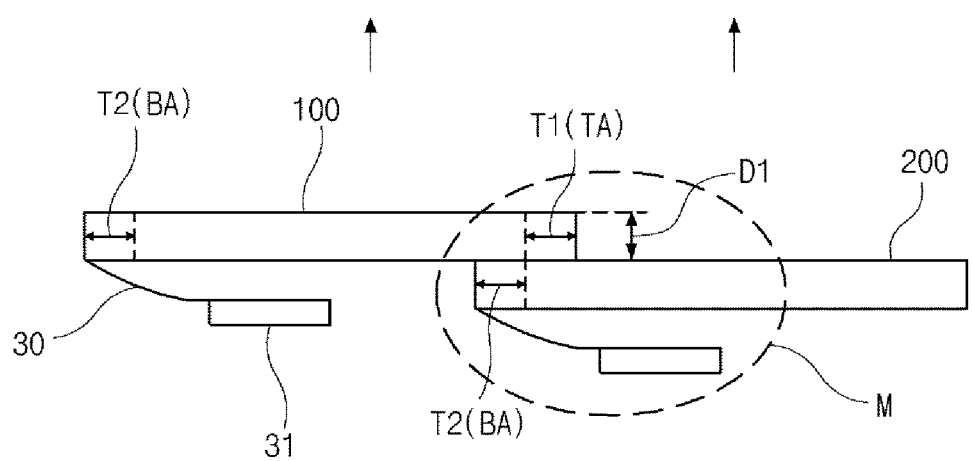
FIG. 6 is a cross-sectional view taken along a line L-L' of FIG. 3.

FIG. 6 is a cross-sectional view taken along a line L-L' of FIG. 3.

In FIG. 6, a side portion of the first display panel 100 is disposed to overlap a portion of the second display panel 200. The non-display region including the transparent region TA and the display region of a right side of the first display panel 100 are disposed to overlap the non-display region and the display region of a left side of the second display panel 200. Since a portion of the display region of the left side of the second display panel 200 is disposed to overlap the transparent region TA of the non-display region BA of the first display panel 100, the image displayed by the display region of the second display panel 200 may be displayed through the transparent region TA of the non-display region of the first display panel 100.

Since the side portions of the first and second display panels 100 and 200 are disposed to overlap each other, a step difference D1 may be generated between the first and second display panels 100 and 200. However, since each of the first and second display panels 100 and 200 has a thickness of about 1.0 mm to about 5.0 mm, the step difference D1 may not be recognized by a user. In addition, when the multi display device is viewed at front, the step difference D1 may be hardly recognized.

In FIG. 6, the side portion of the first display panel 100 is disposed over the side portion of the second display panel 200 such that the first display panel 100 is disposed over the second display panel 200. However, since each of the first and second display panels 100 and 200 has a large-sized thin paper shape, the first and second display panels 100 and 200 may look like two sheets of paper where side portions thereof overlap each other and the step difference D1 may be generated at the side portions of the first and second display panels 100 and 200 overlapping each other. When the multi display device is viewed as a whole, the first and second display panels 100 and 200 may be recognized as a plane shape.

In FIG. 6, an image of the multi display device is upwardly displayed. Since the image is upwardly displayed, the transparent region TA of the non-display region of the first display panel 100 is disposed over the display region of the second display panel 200 so that the first display panel 100 is disposed closer to the user than the second display panel 200. When the image is downwardly displayed, the transparent region TA of the non-display region of the first display panel 100 may be disposed under the display region of the second display panel 200.

The first and second display panels 100 and 200 may be the same type or the different types using different light source. For example, the first display panel 100 may be an organic light emitting diode (OLED) display panel and the second display panel 200 may be an OLED display panel. The first display panel 100 may be an OLED display panel and the second display panel 200 may be a liquid crystal display (LCD) panel. The first display panel 100 may be a plasma display panel (PDP) and the second display panel 200 may be a quantum dot display panel. In addition, the multi display device may include display panels of various types properly disposed based on their own advantages. For example, the OLED panel may have advantages of excellent color reproducibility and excellent flexibility, and the LCD panel may have advantages of long lifetime and low power consumption. In the multi display device, the display panels of different types may be properly disposed according to their own advantages.

Figure 7:
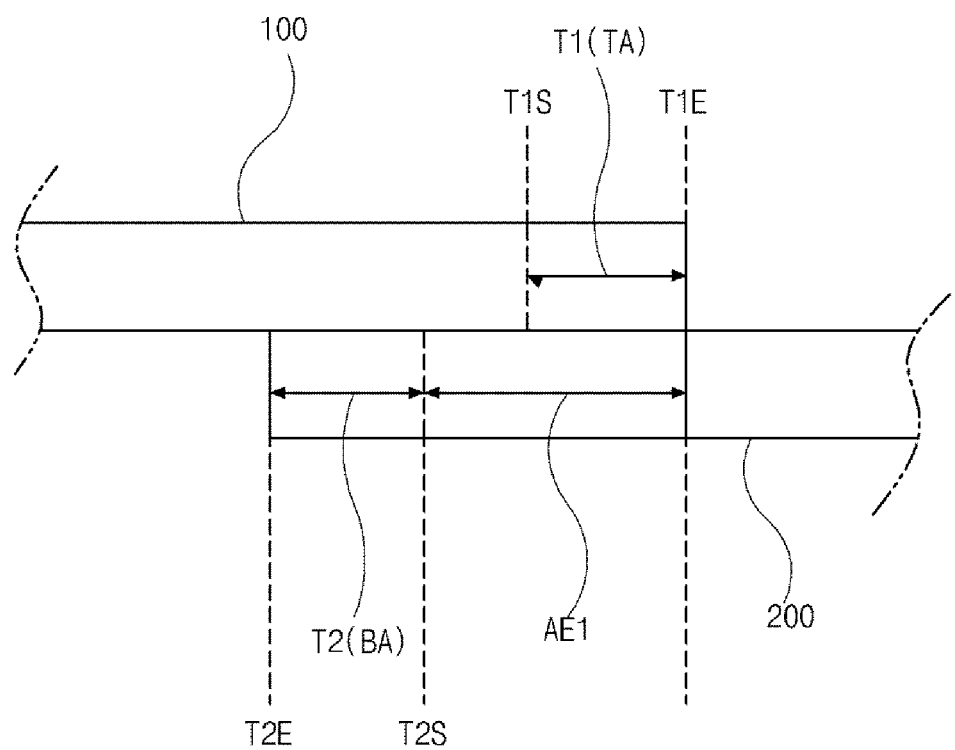
FIG. 7 is a magnified view showing an overlapping portion M of FIG. 6.

FIG. 7 is a magnified view showing an overlapping portion M of FIG. 6.

In FIG. 7, the first distance T1 between a first end T1E of the transparent region TA of the non-display region of the first display panel 100 and a first boundary T1S of the display region of the first display panel 100 may be equal to or smaller than a distance between a second boundary T2S of the display region of the second display panel 200 and the first end T1E of the transparent region TA of the non-display region of the first display panel 100. A portion AE1 of the display region of the second display panel 200 is disposed to be equal to or greater than the transparent region TA of the non-display region of the first display panel 100 so that the overlapping portion M of the first and second display panels 100 and 200 can display a perfect image without a border line. When the portion AE1 of the display region of the second display panel 200 is disposed to be smaller than the transparent region TA of the non-display region of the first display panel 100, a portion of the non-display region BA of the second display panel 200 may be viewed as a border line to a user and the multi display device may not display a perfect image.

The side portion of the first display panel 100 may be disposed over the side portion of the second display panel 200 in the overlapping portion M.

Figure 8:
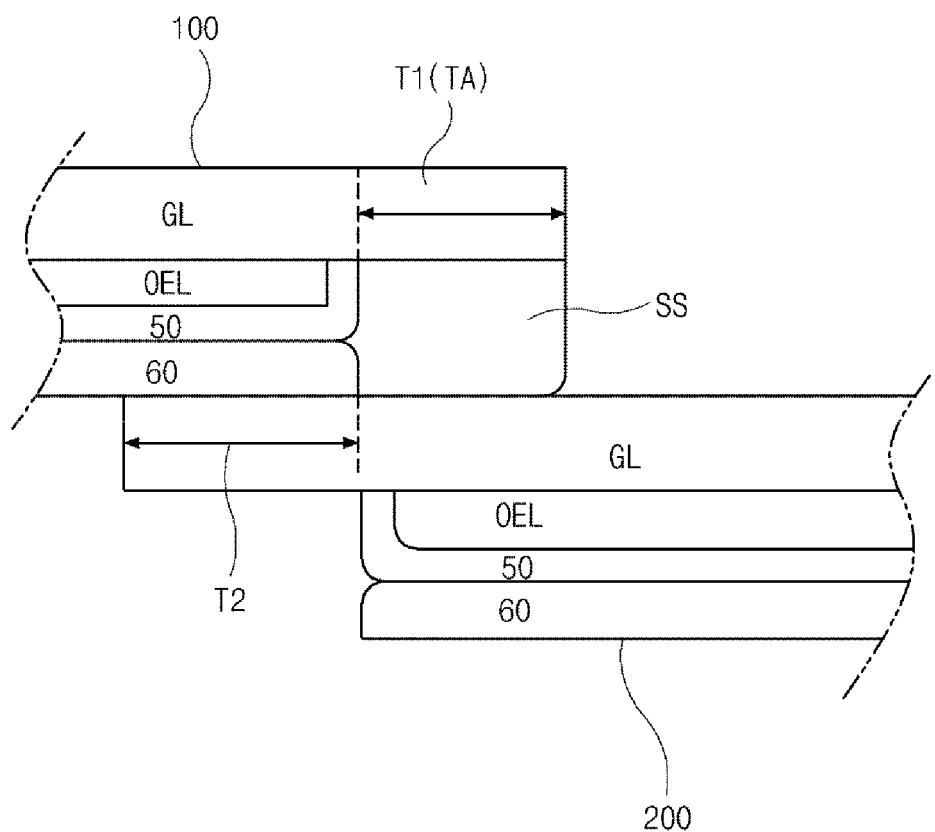
FIG. 8 is a cross-sectional view showing first and second display panels of an organic light emitting diode display panel of a multi display device according to an embodiment of the present disclosure.

FIG. 8 is a cross-sectional view showing first and second display panels of an organic light emitting diode display panel of a multi display device according to an embodiment of the present disclosure.

In FIG. 8, each of first and second display panels 100 and 200 is an organic light emitting diode (OLED) panel. The first display panel 100 includes a first substrate GL, an organic emitting layer OEL on the first substrate GL, an adhesive layer 50 on the organic emitting layer OEL and an encapsulation substrate 60 on the adhesive layer 50. The adhesive layer 50 may protect the organic emitting layer OEL and may combine the first substrate GL and the encapsulation substrate 60. The first substrate GL of the first display panel 100 includes the transparent region TA of the non-display region. A size of the encapsulation substrate 60 may be smaller than a size of the first substrate GL. Accordingly, in the overlapping portion of the first and second display panels 100 and 200, the encapsulation substrate 60 may be smaller than the first substrate GL by a size of the transparent region TA of the non-display region of the first substrate GL. In addition, a side seal SS may be disposed between the first substrate GL and the encapsulation substrate 60 of the first display panel 100. The side seal SS may prevent moisture or air from penetrating into the organic emitting layer OEL and may reinforce adhesion between the first substrate GL and the encapsulation substrate 60. Further, the side seal SS may reduce the step difference of the first substrate GL and the encapsulation substrate 60. The side seal SS may include a transparent material. The transparency of the side seal SS may be adjusted by selecting a material for the side seal SS.

Figure 9:
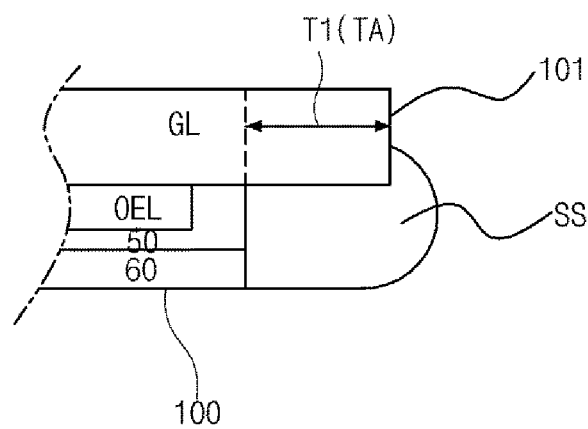
FIG. 9 is a cross-sectional view showing a side seal of a first display panel of a multi display device according to an embodiment of the present disclosure.

FIG. 9 is a cross-sectional view showing a side seal of a first display panel of a multi display device according to an embodiment of the present disclosure.

In FIG. 9, a first display panel 100 includes a first substrate GL and an encapsulation substrate 60 facing and spaced apart from each other. A side seal SS may be disposed at a side portion of the first display panel 100. The side seal SS may partially cover an end portion 101 of the first substrate GL of the first display panel 100. In a step of forming the side seal SS, a shape as well as a size of the side seal SS may be adjusted by selecting a coating method. Accordingly, the size and the shape of the side seal SS may be selected to be pertinent to the display panel or the multi display device according to the present disclosure.

Figure 10:
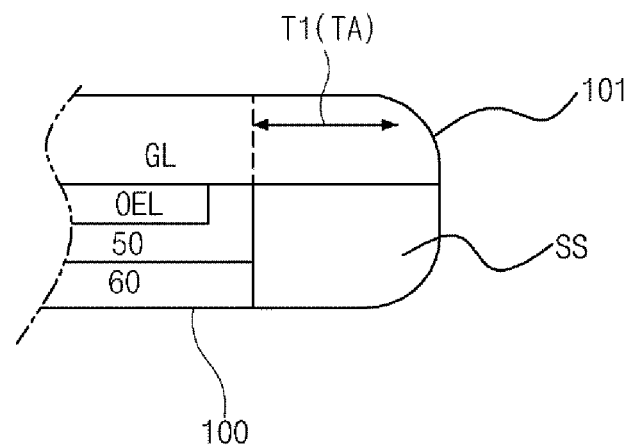
FIG. 10 is a cross-sectional view showing a first substrate of a first display panel of a multi display device according to an embodiment of the present disclosure.

FIG. 10 is a cross-sectional view showing a first substrate of a first display panel of a multi display device according to an embodiment of the present disclosure.

In FIG. 10, an end portion 101 of a first substrate GL of a first display panel 100 has a round shape. The first substrate GL of the first display panel 100 has a transparent region TA of a non-display region where an image displayed by a portion AE1 (of FIG. 7) of a display region of a second display panel 200 (of FIG. 7) passes. As a result, the transparent region TA of the first substrate GL of the first display panel 100 may be required not to obstruct the image display. The end portion 101 in the transparent region TA of the first substrate GL may include upper and lower edges, and at least one of the upper and lower edges of the end portion 101 may have a round shape. When at least one of the upper and lower edges of the end portion 101 has a round shape, a better image may be obtained without obstruction of the image display as compared with the end portion 101 of a rectangular shape. The round shape may include a circular shape or an elliptical shape having a curvature greater than 0. In addition, a portion of the round shape may include a polygonal shape having a definite angle. The round shape of the end portion 101 of the first substrate GL may be obtained by a fabrication method such as a grinding method or a chipping method. Similarly, when the encapsulation substrate 60 extends over the transparent region TA of the non-display region of the first substrate GL, an end portion of the encapsulation substrate 60 may have a round shape.

Figure 11:
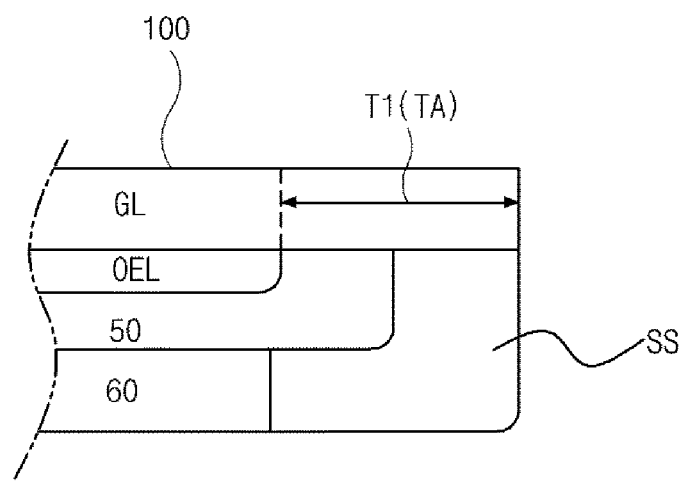
FIG. 11 is a cross-sectional view showing an adhesive layer of a first display panel of a multi display device according to an embodiment of the present disclosure.

FIG. 11 is a cross-sectional view showing an adhesive layer of a first display panel of a multi display device according to an embodiment of the present disclosure.

In FIG. 11, a first display panel 100 includes a first substrate GL, an organic emitting layer OEL on the first substrate GL, an adhesive layer 50 on the organic emitting layer OEL and an encapsulation substrate 60 on the adhesive layer 50. The adhesive layer 50 may extend over a transparent region TA of a non-display region of the first substrate GL, or extend to the transparent region TA. The adhesive layer 50 may include an opaque material in a display region and a transparent material in the non-display region. Alternatively, the adhesive layer 50 may include a transparent material in the display region and the non-display region. In addition, a shape of a side seal SS may be changed according to a shape of the adhesive layer 50.

Figure 12:
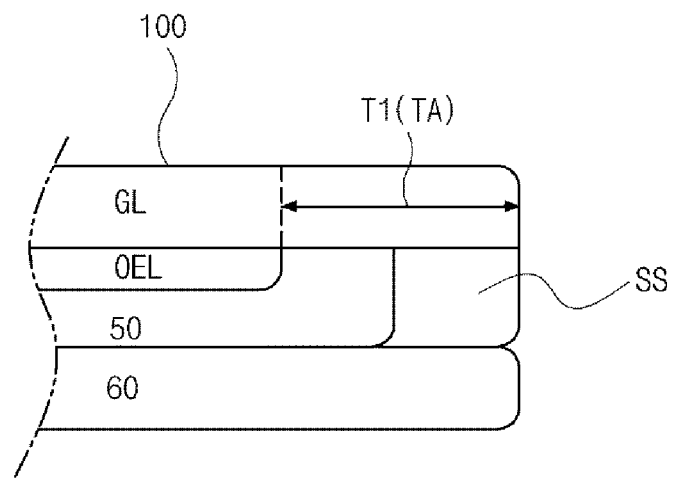
FIG. 12 is a cross-sectional view showing an encapsulation substrate of a first display panel of a multi display device according to an embodiment of the present disclosure.

FIG. 12 is a cross-sectional view showing an encapsulation substrate of a first display panel of a multi display device according to an embodiment of the present disclosure.

In FIG. 12, a first display panel 100 includes a first substrate GL, an organic emitting layer OEL on the first substrate GL, an adhesive layer 50 on the organic emitting layer OEL and an encapsulation substrate 60 on the adhesive layer 50. The encapsulation substrate 60 may extend over a transparent region TA of a non-display region of the first substrate GL, or extend to an overlapping portion between the first display panel 100 and the second display panel 200. An end portion of the encapsulation substrate 60 of the first display panel 100 may have substantially the same size as an end portion of the transparent region TA of the non-display region of the first substrate GL. The encapsulation substrate 60 may include a transparent material in a display region and the non-display region. Alternatively, the encapsulation substrate 60 may an opaque material in the display region and a transparent material in the transparent region TA of the non-display region.

Figure 13:
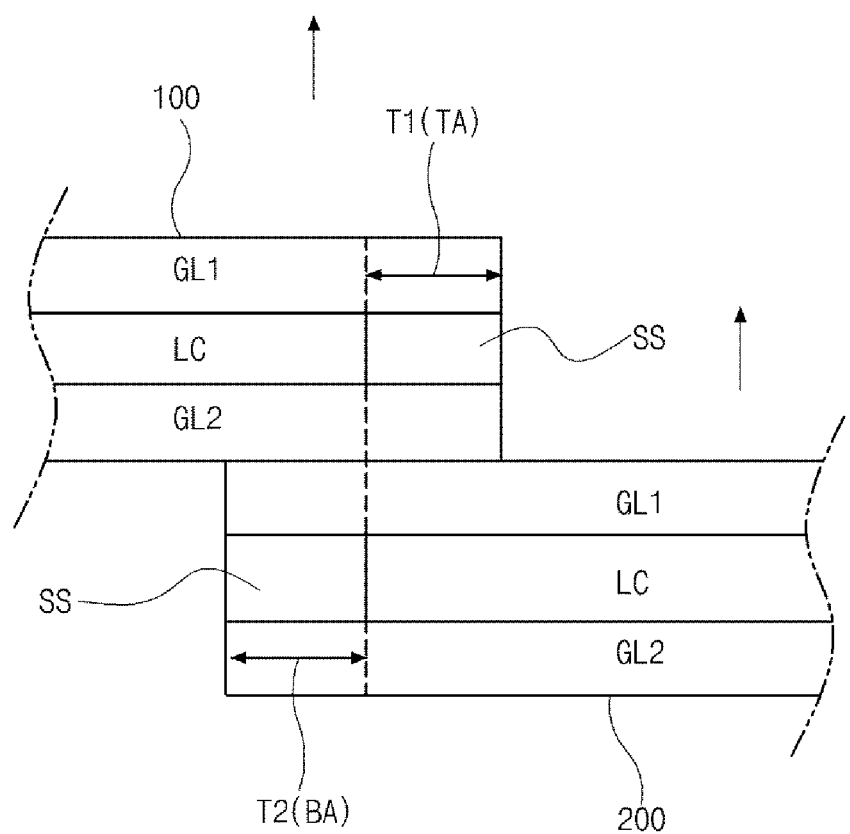
FIG. 13 is a cross-sectional view showing first and second display panels of a liquid crystal display panel of a multi display device according to an embodiment of the present disclosure.

FIG. 13 is a cross-sectional view showing first and second display panels of a liquid crystal display panel of a multi display device according to an embodiment of the present disclosure.

In FIG. 13, each of first and second display panels 100 and 200 is a liquid crystal display (LCD) panel. The first display panel 100 includes first and second substrates GL1 and GL2, a liquid crystal layer LC between the first and second substrates GL1 and GL2 and a side seal SS. The first display panel 100 includes a display region as a central portion and a non-display region surrounding the display region. The second display panel 200 has a similar structure to the first display panel 100. The first and second display panels 100 and 200 are disposed to be adjacent to each other. The non-display region of the first display panel 100 includes a transparent region TA, and the transparent region of the first display panel 100 is disposed to overlap the display region of the second display panel 200. Since an image of the multi display device is upwardly displayed, the first display panel 100 is disposed over the second display panel 200 in an overlapping portion of the first and second display panels 100 and 200.

Figure 14:
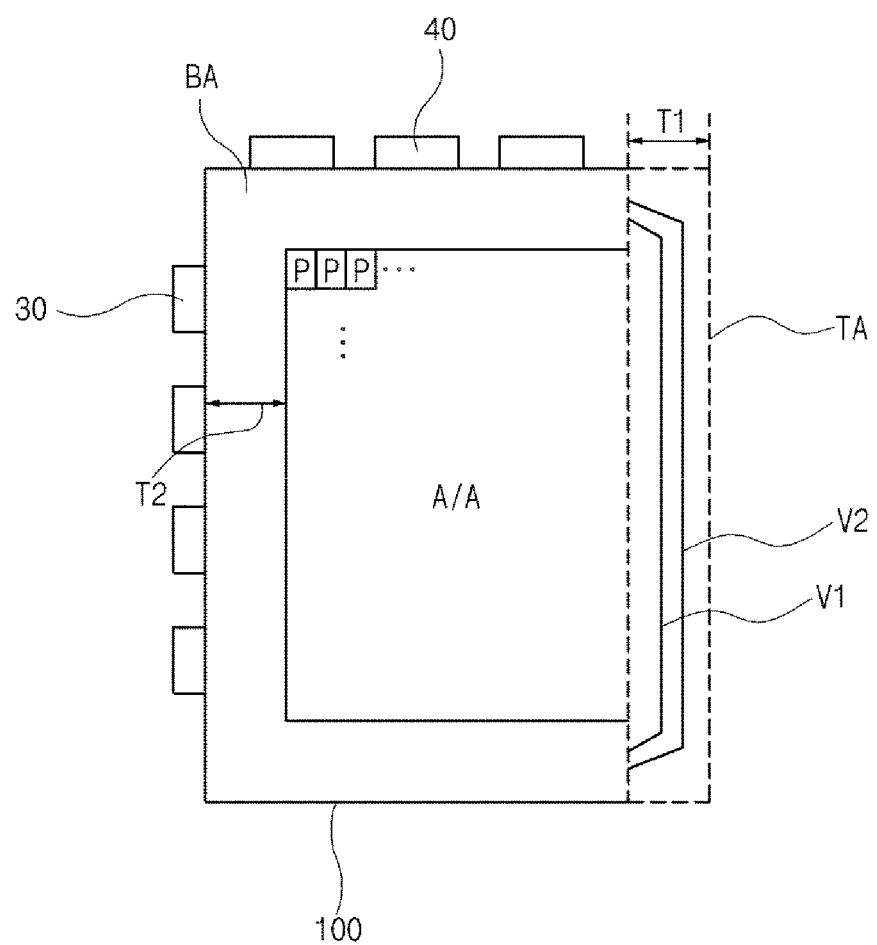
FIG. 14 is a plan view showing a conductive line of a first display panel of a multi display device according to an embodiment of the present disclosure.

FIG. 14 is a plan view showing a conductive line of a first display panel of a multi display device according to an embodiment of the present disclosure.

In FIG. 14, a first display panel 100 includes a display region A/A having a plurality of pixels P for displaying an image and a non-display region BA at periphery of the display region A/A. A gate driver 40 for supplying a gate signal to the display region A/A is disposed at an upper side of the first display panel 100, and a data driver 30 for supplying a data signal to the display region A/A is disposed at a left side of the first display panel 100. A portion of the non-display region BA may include a transparent region TA. A plurality of conductive lines V1 and V2 such as a signal line for supplying an image signal to the display region A/A, a power line for supplying a power, a dummy line for an additional function, an anti-electrostatic line and a floating line for a power may be disposed in the transparent region TA. The plurality of conductive lines V1 and V2 may include a transparent material in the transparent region TA. For example, the plurality of conductive lines V1 and V2 may a transparent conductive material such as indium tin oxide (ITO), indium zinc oxide (IZO), zinc oxide (ZnO) and indium gallium zinc oxide (IGZO).

Figure 15:
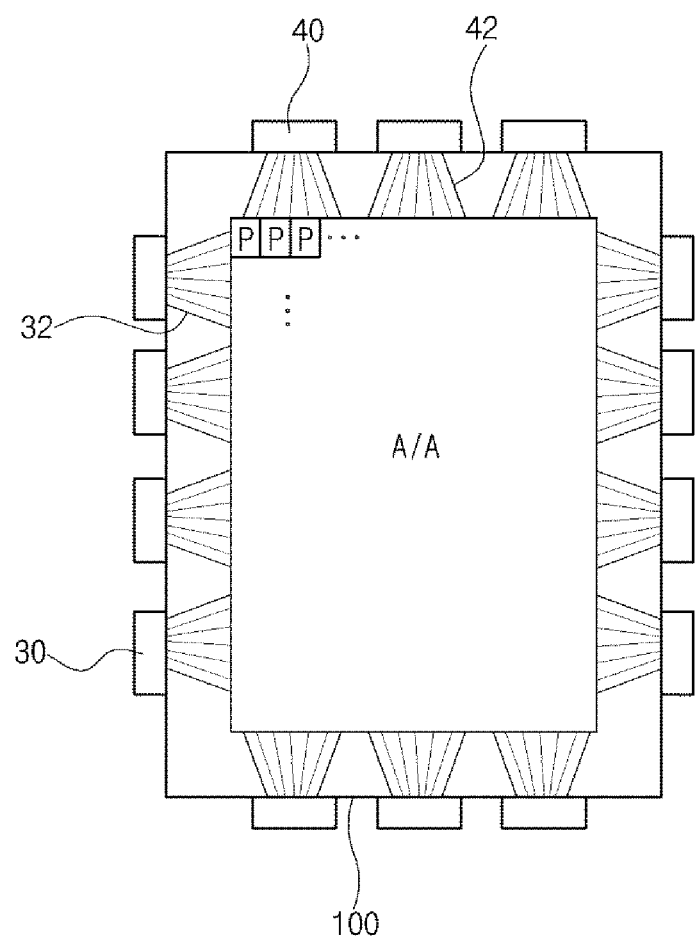
FIG. 15 is a plan view showing a conductive line of a first display panel of a multi display device according to an embodiment of the present disclosure.

FIG. 15 is a plan view showing a conductive line of a first display panel of a multi display device according to an embodiment of the present disclosure.

In FIG. 15, a first display panel 100 includes a display region A/A having a plurality of pixels P for displaying an image and a non-display region BA (of FIG. 14) at periphery of the display region A/A. A gate driver 40 for supplying a gate signal to the display region A/A is disposed at upper and lower sides of the first display panel 100, and a data driver 30 for supplying a data signal to the display region A/A is disposed at left and right sides of the first display panel 100. A gate link line 42 for transmitting the gate signal of the gate driver 40 to the display region A/A and a data link line 32 for transmitting the data signal of the data driver 30 to the display region A/A may be disposed in the non-display region BA. The gate link line 42 and the data link line 32 may include a transparent conductive material. The whole non-display region BA surrounding the display region A/A may be formed to be transparent. Alternatively, a portion of the non-display region BA may be formed to be selectively transparent.

FIGS. 16A to 16D are plan views showing a non-display region of a first substrate of a multi display device according to embodiments of the present invention.

In FIGS. 16A to 16D, a first display panel 100 includes a display region A/A and a non-display region BA (of FIG. 14) at periphery of the display region A/A.

Figure 16A:
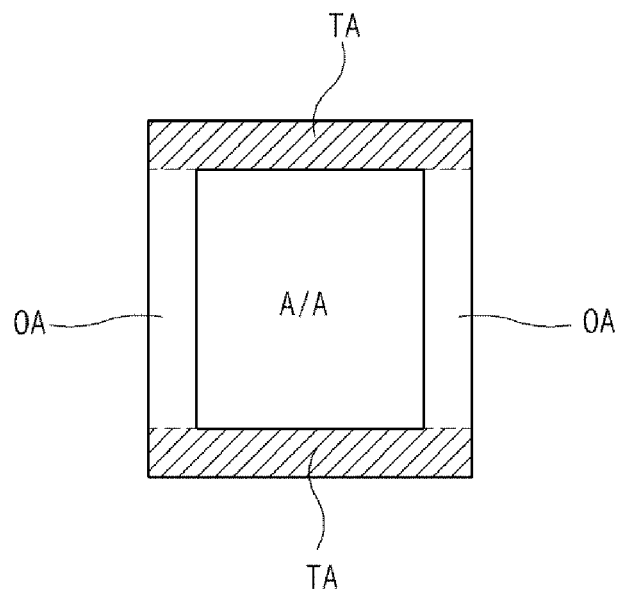
FIGS. 16A to 16D are plan views showing a non-display region of a first substrate of a multi display device according to embodiments of the present invention.

In FIG. 16A, upper and lower sides of the non-display region BA of the first display panel 100 include a transparent region TA, and left and right sides of the non-display region BA of the first display panel 100 include an opaque region OA.

Figure 16B:
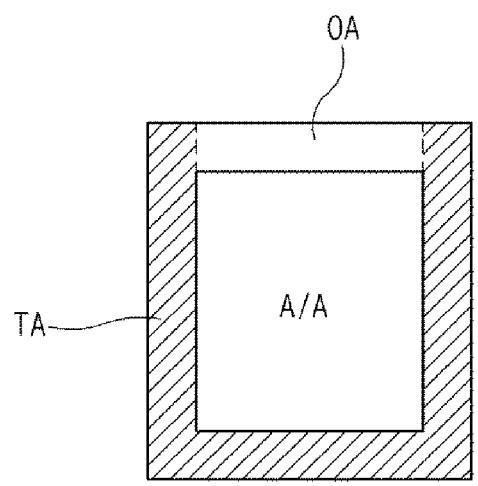

In FIG. 16B, left, right and lower sides of the non-display region BA of the first display panel 100 include a transparent region TA, and an upper side of the non-display region BA of the first display panel 100 includes an opaque region OA.

Figure 16C:
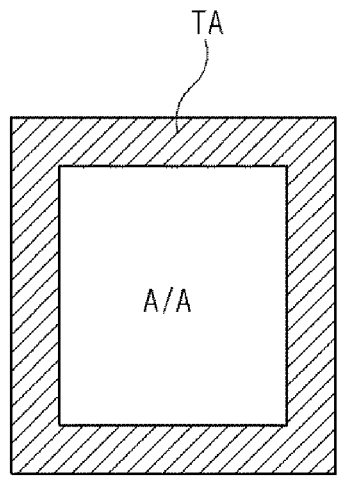

In FIG. 16C, left, right, upper and lower sides of the non-display region BA of the first display panel 100 include a transparent region TA.

Figure 16D:
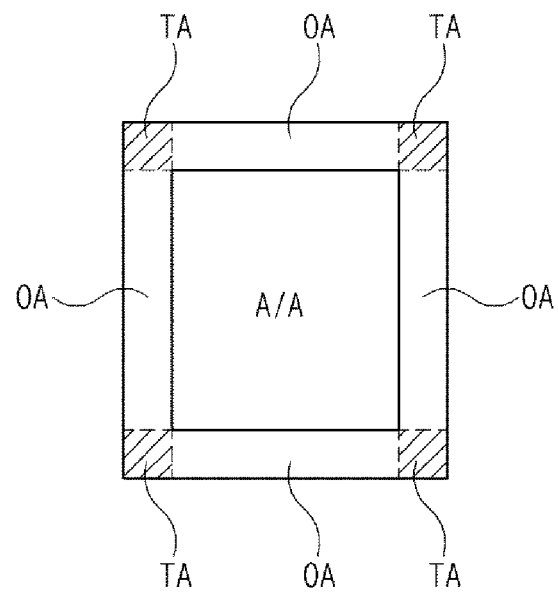

In FIG. 16D, left and right portions of an upper side of the non-display region BA of the first display panel 100 include a transparent region TA, and left and right portions of a lower side of the non-display region BA of the first display panel 100 include a transparent region TA.

The transparent region TA may be disposed at various positions in the non-display region BA.

Figure 17:
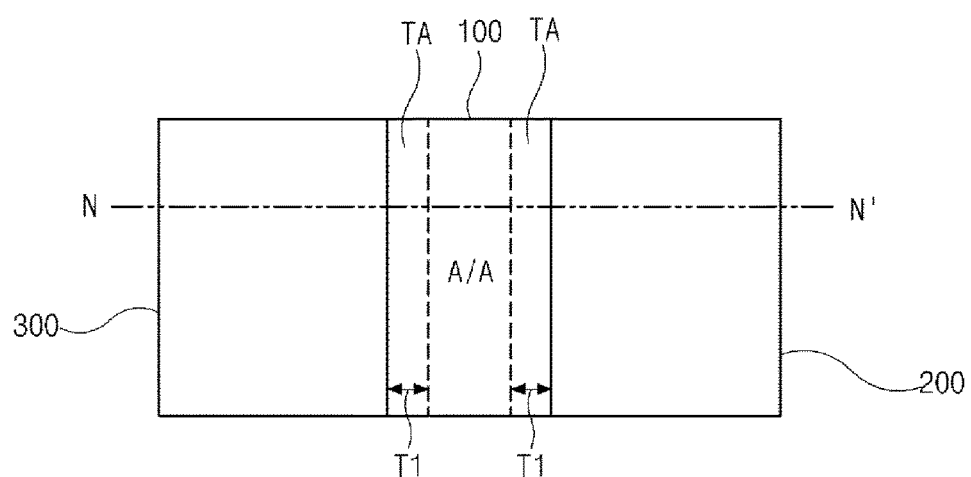
FIG. 17 is a plan view showing a multi display device according to an embodiment of the present invention.

FIG. 17 is a plan view showing a multi display device according to an embodiment of the present invention.

In FIG. 17, a multi display device according to the embodiment of the present disclosure includes first, second and third display panels 100, 200 and 300. The second display panel 200 is disposed to be adjacent to a right side of the first display panel 100, and the third display panel 300 is disposed to be adjacent to a left side of the first display panel 100. The first display panel 100 includes a display region A/A at a central portion thereof and transparent regions TA of a non-display region at left and right side of the display region A/A. As a result, the non-display region of the first display panel 100 includes at least two transparent regions TA. In addition, a size of the display region A/A of the first display panel 100 may be smaller than a size of the display region A/A of the second display panel 200 or a size of the display region A/A of the third display panel 300. Since the display region A/A of the first display panel 100 is minimized, an image displayed by the multi display device may be generated substantially by the display region A/A of the second display panel 200 and the display region A/A of the third display panel 300. As a result, the image is generated by a single horizontal surface and a perfect image without distortion is obtained.

Figure 18:
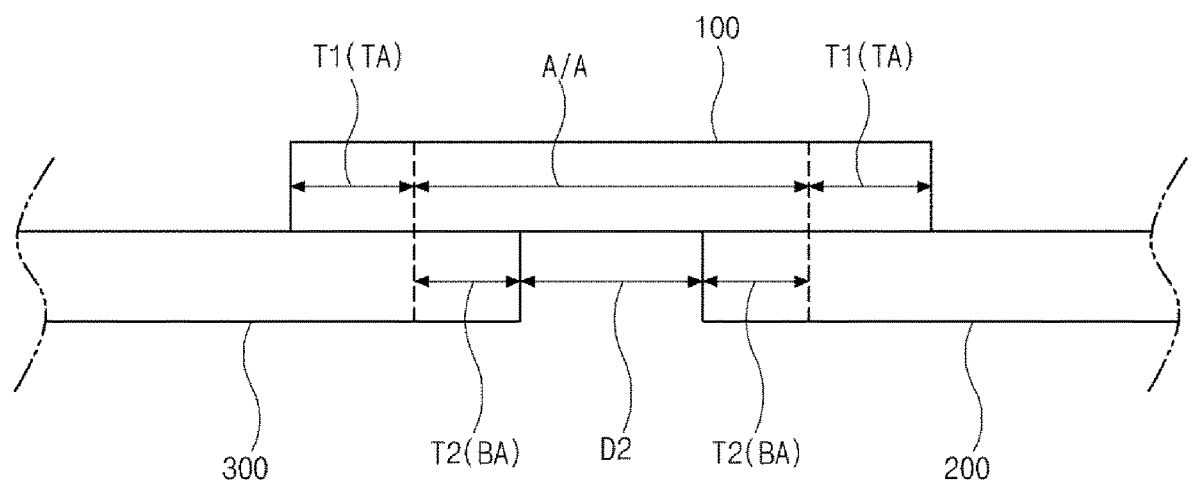
FIG. 18 is a cross-sectional view taken along a line N-N' of FIG. 17.

FIG. 18 is a cross-sectional view taken along a line N-N' of FIG. 17.

In FIG. 18, the right side of the first display panel 100 overlaps the left side of the second display panel 200, and the left side of the first display panel 100 overlaps the right side of the third display panel 300. The transparent region TA of the non-display region and a portion of the display region A/A of the right side of the first display panel 100 are disposed to overlap the non-display region BA and a portion of the display region of the left side of the second display panel 200. In addition, the transparent region TA of the non-display region and a portion of the display region A/A of the left side of the first display panel 100 are disposed to overlap the non-display region BA and a portion of the display region of the right side of the third display panel 300. Since the at least two transparent regions TA of the non-display region of the first display panel 100 are disposed to overlap the portion of the display region of the second display panel 200 and the portion of the display region of the third display panel 300, respectively, the images displayed by the portions of the display regions of the second and third display panels 200 and 300 may be displayed through the at least two transparent regions TA of the non-display region of the first display panel 100. A gap distance D2 between the second and third display panels 200 and 300 may be adjusted according to a size of the first display panel 100. For example, when the second and third display panels 200 and 300 are disposed to contact each other, the gap distance D2 may become 0.

Referring again to FIG. 17, since the transparent region TA is disposed at the left and right sides of the display region A/A, a gate driver or a data driver may be disposed on a rear surface of the display region A/A at an upper side or a lower side of the first display panel 100. For example, the gate driver or the data driver may be attached to the first display panel 100 using a technology such as a side bonding. In addition, the upper side or the lower side of the first display panel 100 may protrude from the upper side or the lower side of the second display panel 200 or the upper side or the lower side of the third display panel 300 for pads contacting the gate driver or the data driver.

Figure 19:
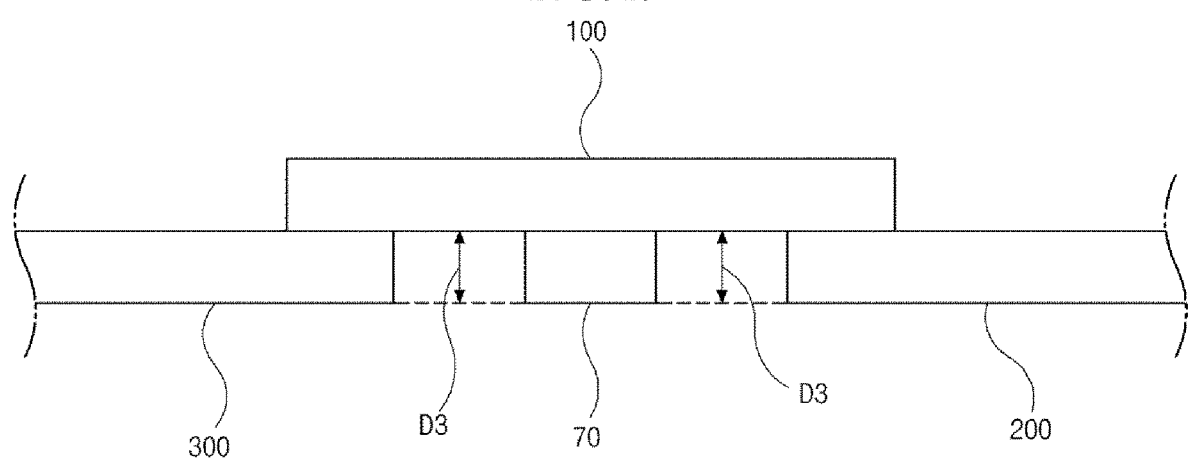
FIG. 19 is a cross-sectional view showing a multi display device according to an embodiment of the present disclosure.

FIG. 19 is a cross-sectional view showing a multi display device according to an embodiment of the present disclosure. Illustrations for the same part as FIG. 17 will be omitted.

In FIG. 19, since a first display panel 100 is disposed over second and third display panels 200 and 300, a step difference D3 may be generated between a rear surface of the first display panel 100 and a rear surface of the second display panel 200 and between the rear surface of the first display panel 100 and a rear surface of the third display panel 300. A central portion of the first display panel 100 may sag due to the step difference D3. To prevent the sagging, a step difference controlling portion 70 may be disposed under the first display panel 100 or between the second and third display panels 200 and 300. As a result, the step difference D3 between the first and second display panels 100 and 200 and between the first and third display panels 100 and 300 may be adjusted by the step difference controlling portion 70. Although the step difference controlling portion 70 is used for the first, second and third display panels 100, 200 and 300 in FIG. 19, the step difference controlling portion 70 is not limited to three display panels.

Figure 20:
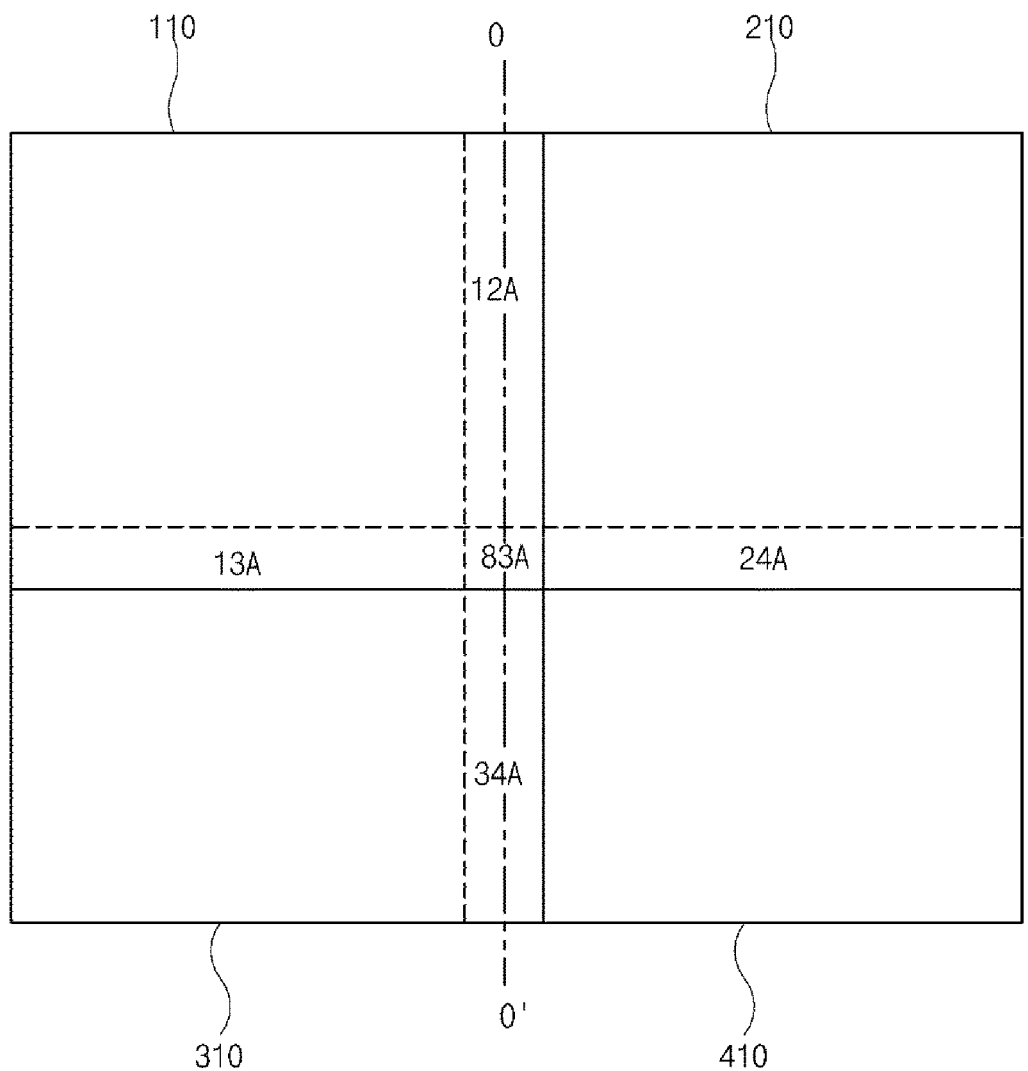
FIG. 20 is a plan view showing a multi display device according to an embodiment of the present disclosure.

FIG. 20 is a plan view showing a multi display device according to an embodiment of the present disclosure.

In FIG. 20, a multi display device according to the embodiment of the present disclosure includes first, second, third and fourth display panels 110, 210, 310 and 410. Although the multi display device includes four display panels in FIG. 20, the multi display device may include a plurality of panels more than 4 in another embodiment. The first, second, third and fourth display panels 110, 210, 310 and 410 are disposed to have overlapping portions with each other. For example, the first display panel 110 may have a first overlapping portion 12A with the second display panel 210 and a second overlapping portion 13A with the third display panel 310. The second display panel 210 may have a third overlapping portion 24A with the fourth display panel 410, and the third display panel 310 may have a fourth overlapping portion 34A with the fourth display panel 410. The first, second, third and fourth overlapping portions 12A, 13A, 24A and 34A may be defined by overlapping of at least two of the first, second, third and fourth display panels 110, 210, 310 and 410. In addition, a non-display region of at least one of the first, second, third and fourth display panels 110, 210, 310 and 410 may have a transparent region in the first, second, third and fourth overlapping portions 12A, 13A, 24A and 34A. Since a fifth overlapping portion 83A is defined by overlapping of the first, second, third and fourth display panels 110, 210, 310 and 410, the non-display region of three of the first, second, third and fourth display panels 110, 210, 310 and 410 may have the transparent region.

Figure 21A:
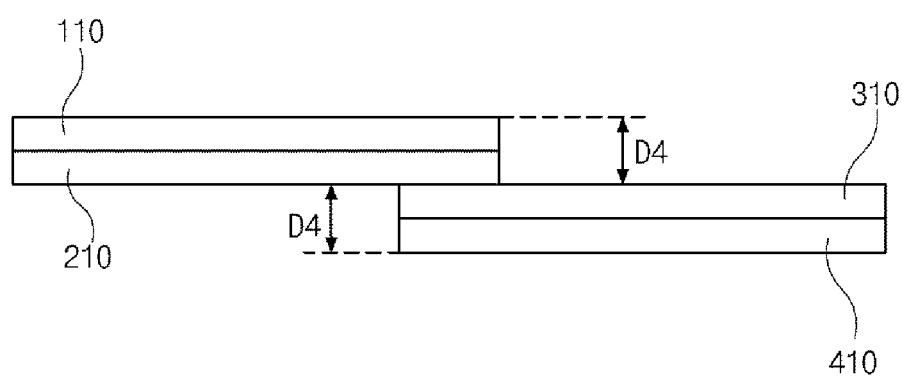
FIGS. 21A and 21B are cross-sectional views taken along a line O-O' of FIG. 20.
Figure 21B:
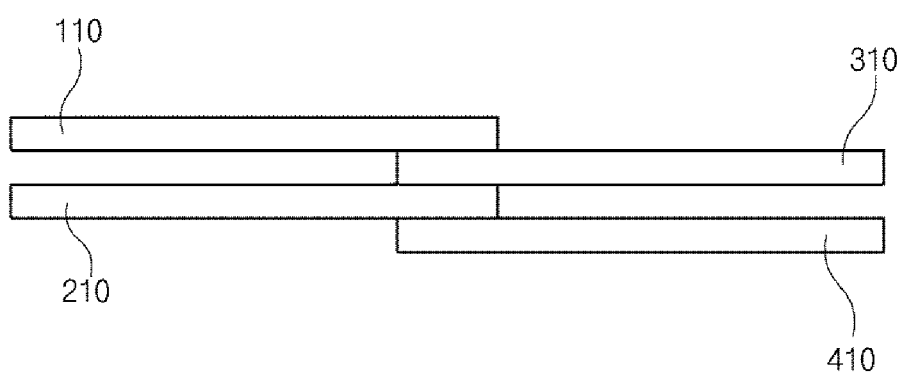

FIGS. 21A and 21B are cross-sectional views taken along a line O-O' of FIG. 20.

In FIG. 21A, the first and second display panels 110 and 210 have the first overlapping portion 12A (of FIG. 20) where the first and second display panels 110 and 210 directly contact each other. Similarly, the third and fourth display panels 310 and 410 have the fourth overlapping portion 34A (of FIG. 20) where the third and fourth display panels 310 and 410 directly contact each other. When the multi display device according to the embodiment of the present disclosure is viewed at a side portion, a step difference D4 may be generated between the upper first and second display panels 110 and 210 and the lower third and fourth display panels 310 and 410. However, as illustrated in FIG. 6, since the step difference D4 is hardly recognized by a user, a perfect image may be displayed by the multi display device.

In FIG. 21B, the first and third display panels 110 and 310 have the second overlapping portion 13A (of FIG. 20) where the first and third display panels 110 and 310 directly contact each other. Similarly, the second and fourth display panels 210 and 410 have the third overlapping portion 24A (of FIG. 20) where the second and fourth display panels 210 and 410 directly contact each other.

Figure 22:
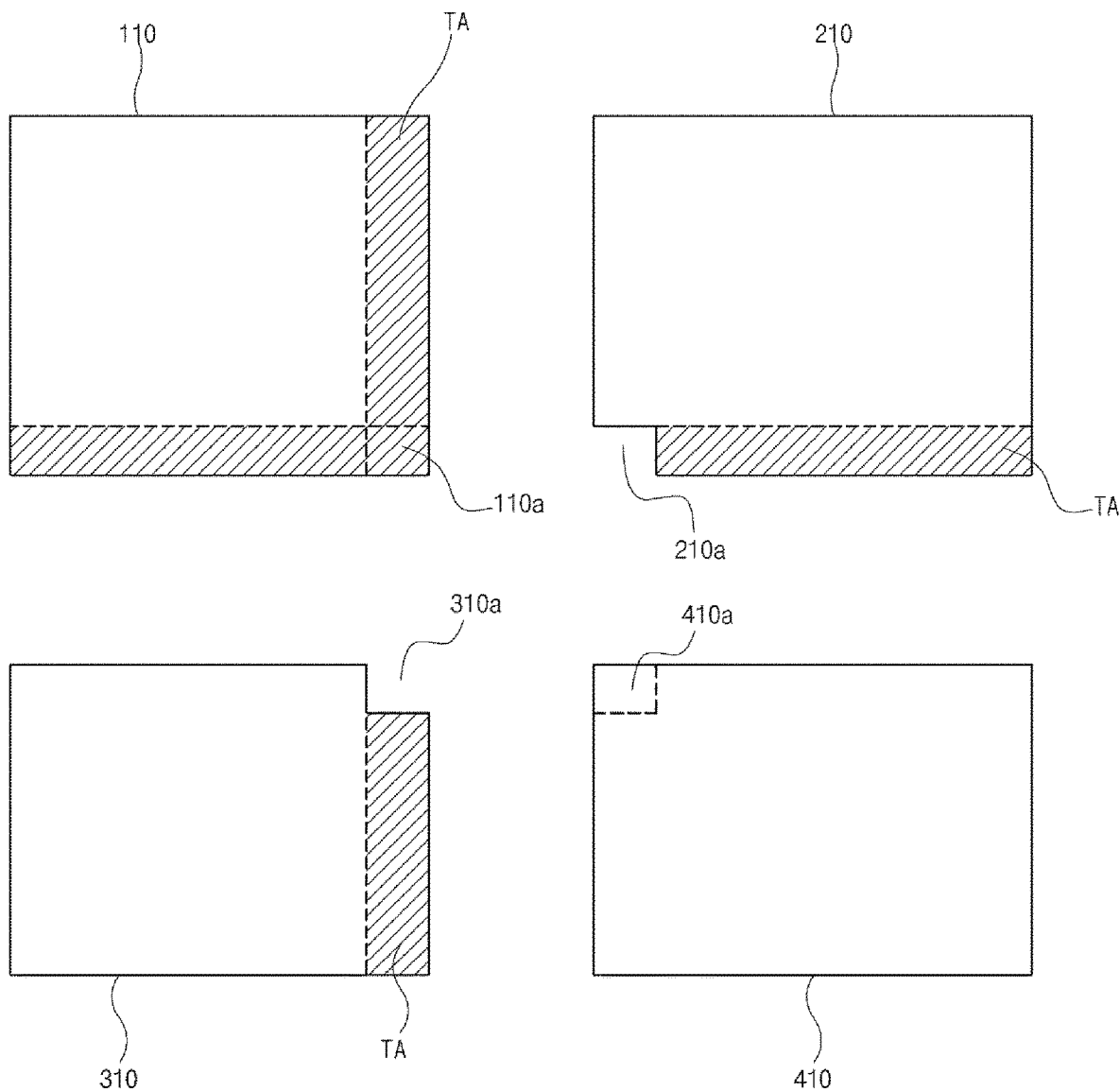
FIG. 22 is an exploded plan view showing a multi display device according to an embodiment of the present disclosure.

FIG. 22 is an exploded plan view showing a multi display device according to an embodiment of the present disclosure.

In FIG. 22, a non-display region of a first display panel 110 includes at least two transparent regions TA having an edge portion 110a. A non-display region of a lower side of a second display panel 210 includes a transparent region TA having a chamfer where an edge portion 210a is removed. A non display region of a right side of a third display panel 310 includes a transparent region TA having a chamfer where an edge portion 310a is removed. An edge portion 410a of a display region of a fourth display panel 410 may correspond to a central portion of the multi display device including the first, second, third and fourth display panels 110, 210, 310 and 410. Since the first, second, third and fourth display panels 110, 210, 310 and 410 overlap each other at the central portion of the multi display device, a step difference of the first, second, third and fourth display panels 110, 210, 310 and 410 may be greater by twice than a step difference of two display panels. As a result, the step difference may be reduced due to the chamfers of the second and third display panels 210 and 310 which are formed by removing the edge portions 210a and 310a of the second and third display panels 210 and 310.

Consequently, in a multi display device according to an embodiment of the present disclosure, since at least two display panels are disposed to be adjacent to each other such that a transparent region of a non-display region of one display panel overlaps a display region of another display panel, the non-display region is hardly recognized by a user. Accordingly, the multi display device according to the embodiment of the present disclosure is recognized to have no non-display region of the central portion so that a perfectly smooth image can be displayed.

In a multi display device according to an embodiment of the present disclosure, since an end portion of one of upper and lower substrates of at least one display panel has a round shape in an overlapping portion, a non-display region is hardly recognized by a user. Accordingly, recognition of an image is improved.

In a multi display device according to an embodiment of the present disclosure, although a step difference is generated in an overlapping portion of two display panels, the step difference is hardly recognized by a user because the two display panels look like two sheets of a large-sized thin paper where side portions thereof overlap each other. Accordingly, the multi display device may display a substantially plane image.

In a multi display device according to an embodiment of the present disclosure, since at least two display panels are disposed to overlap each other, a series of a plurality of display panels may constitute the multi display device.

In a multi display device according to an embodiment of the present disclosure, since a plurality of conductive lines include a transparent material in a non-display region, a portion of the non-display region may be formed to be transparent.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multi display device comprising:
   a first display panel including a display region having a plurality of pixels for displaying an image and a non-display region at a periphery of the display region; and
   a second display panel including a display region having a plurality of pixels for displaying an image and a non-display region at a periphery of the display region of the second display panel,
   wherein a portion of the non-display region of the first display panel includes a transparent region,
   wherein the second display panel is disposed such that a portion of the display region of the second display panel overlaps the transparent region of the non-display region of the first display panel,
   wherein the transparent region of the non-display region of the first display panel includes a plurality of conductive lines made of a transparent material,
   wherein the first and second display panels include an overlapping portion where a first side of the first display panel is disposed over a second side of the second display panel to overlap the second display panel,
   wherein, in the overlapping portion, a distance between an end of the first display panel and a boundary of the display region of the second display panel is greater than a distance between the end of the first display panel and a boundary of the display region of the first display panel,
   wherein the image displayed by the display region of the second display panel is displayed through the transparent region of the non-display region of the first display panel,
   wherein a width of the non-display region along a second side of the first display panel is different from a width of the transparent region of the non-display region along the first side of the first display panel,
   wherein a gate link line connected to a gate driver for transmitting a gate signal is disposed in the transparent region of the non-display region of the first display panel and the gate link line includes a transparent conductive material, and
   wherein a data link line connected to a data driver for transmitting a data signal is disposed in the transparent region of the non-display region of the first display panel and the data link line includes a transparent conductive material.

2. The multi display device of claim 1, wherein, in the overlapping portion, an end of the second display panel includes the display region and the non-display region of the second display panel.

3. The multi display device of claim 1, further comprising a third display panel,
   wherein a portion of the non-display region of the second display panel includes a transparent region, and
   wherein the third display panel is disposed such that a portion of a display region of the third display panel overlaps the transparent region of the non-display region of the second display panel.

4. The multi display device of claim 1, wherein the first display panel includes the data driver, and
   wherein the gate driver and the data driver are disposed on a rear surface of the display region of the first display panel.

5. The multi display device of claim 1, wherein the first display panel includes a first substrate, and a second substrate facing the first substrate and extending to the overlapping portion, and
   wherein, in the overlapping portion, a portion of the second substrate includes a transparent region.

6. The multi display device of claim 1, wherein the first and second display panels are of different display types.

7. The multi display device of claim 1, wherein the first display panel includes a first substrate, an organic emitting layer on the first substrate and an adhesive layer and a second substrate on the organic emitting layer, and
   wherein, in the transparent region of the non-display region of the first display panel, the adhesive layer extends to the transparent region and includes a transparent material.

8. The multi display device of claim 1, wherein the first display panel includes a first substrate, a second substrate facing the first substrate, and a side seal disposed between the first and second substrates and including a transparent material.

9. The multi display device of claim 1, wherein the first display panel includes a first substrate, and
   wherein at least one of upper and lower edges of an end portion of the first substrate has a round shape.

10. The multi display device of claim 1, further comprising a third display panel,
    wherein the third display panel is disposed to be adjacent to the first display panel, and
    wherein the third display panel is disposed such that a portion of a display region of the third display panel overlaps the transparent region of the non-display region of the first display panel.

11. The multi display device of claim 10, wherein a size of the display region of the first display panel is smaller than a size of the display region of one of the second and third display panels.

12. The multi display device of claim 10, further comprising a step difference controlling portion disposed under the first display panel and adjusting a step difference between the first and second display panels and between the first and third display panels.

13. The multi display device of claim 1, further comprising third and fourth display panels,
- wherein a portion of a non-display region of each of the third and fourth display panels includes a transparent region,
- wherein the third display panel is disposed to be adjacent to the first display panel,
- wherein the third display panel is disposed such that a portion of the display region of the third display panel overlaps the transparent region of the non-display region of the first display panel,
- wherein the fourth display panel is disposed to be adjacent to the second display panel, and
- wherein a portion of a non-display region of the second display panel includes a transparent region, and the fourth display panel is disposed such that a portion of a display region of the fourth display panel overlaps the transparent region of the non-display region of the second display panel.

14. The multi display device of claim 13, wherein a portion of the non-display region of each of the second and third display panel includes a chamfer.

15. The multi display device of claim 1, further comprising a side seal disposed under the transparent region of the non-display region of the first display panel to reduce a step difference of a substrate and an encapsulation substrate of the first display panel.

16. A display device, comprising:
- a first display panel and a second display panel, each of the first and second display panels including:
- a display region having a plurality of pixels for displaying an image, and a non-display region at a periphery of the display region;
- a gate driver configured to supply a gate signal to the display region; and
- a data driver configured to supply a data signal to the display region,
- wherein the non-display region of at least one of the first and second display panels includes a plurality of conductive lines,
- wherein a portion of the non-display region includes a transparent region,
- wherein the plurality of conductive lines are made of a transparent material,
- wherein the first and second display panels include an overlapping portion where a first side of the first display panel is disposed over a second side of the second display panel to overlap the second display panel,
- wherein, in the overlapping portion, a distance between an end of the first display panel and a boundary of the display region of the second display panel is greater than a distance between the end of the first display panel and a boundary of the display region of the first display panel,
- wherein the image displayed by the display region of the second display panel is displayed through the transparent region of the non-display region of the first display panel,
- wherein a width of the non-display region along a second side of the first display panel is different from a width of the transparent region of the non-display region along the first side of the first display panel,
- wherein a gate link line connected to the gate driver for transmitting the gate signal is disposed in the transparent region of the non-display region of the first display panel and the gate link line includes a transparent conductive material, and
- wherein a data link line connected to the data driver for transmitting the data signal is disposed in the transparent region of the non-display region of the first display panel and the data link line includes a transparent conductive material.

17. The display device of claim 16, wherein the plurality of conductive lines include a power line, a signal line and a dummy line.

18. The display device of claim 16, wherein the display panel includes a first substrate, an organic emitting layer on the first substrate and an adhesive layer and a second substrate on the organic emitting layer, and
- wherein, in the transparent region of the non-display region of the display panel, the adhesive layer extends to the transparent region and includes a transparent material.

19. The display device of claim 16, wherein the display panel includes a first substrate, a second substrate facing the first substrate, and a side seal disposed between the first and second substrates and including a transparent material.

20. The display device of claim 16, wherein the display panel includes a first substrate, and
- wherein at least one of upper and lower edges of an end portion of the first substrate has a round shape.

21. A multi display device comprising:
- a first display panel including a display region and a non-display region at a periphery of the display region, and the non-display region of the first display panel includes a transparent region at a side portion thereof; and
- a second display panel including a display region and a non-display region at a periphery of the display region, and the non-display region of the second display panel includes a transparent region at a side portion thereof,
- wherein the display region of a first side of the first display panel overlaps the non-display region and the display region of a second of the second display panel and a portion of the display region of second side of the second display panel overlaps the transparent region of the non-display region of the first display panel, so that an image of the display region of the second display panel is displayed through the transparent region of the non-display region of the first display panel at an overlapping portion of the first and second display panels and the transparent region of the non-display region at a central portion between the first and second display panels is not recognized, thereby displaying the image without a border line at the overlapping portion,
- wherein the transparent region of the non-display region of the first display panel includes a plurality of conductive lines made of a transparent material,
- wherein the first and second display panels include an overlapping portion where the first display panel is disposed over the second display panel to overlap the second display panel,
- wherein, in the overlapping portion, a distance between an end of the first display panel and a boundary of the display region of the second display panel is greater than a distance between the end of the first display panel and a boundary of the display region of the first display panel,
- wherein a width of the non-display region along the second side of the first display panel is different from a width of the transparent region of the non-display region along the first side of the first display panel, wherein a gate link line connected to a gate driver for transmitting a gate signal is disposed in the transparent region of the non-display region of the first display panel and the gate link line includes a transparent conductive material, and wherein a data link line connected to a data driver for transmitting a data signal is disposed in the transparent region of the non-display region of the first display panel and the data link line includes a transparent conductive material.

22. The multi display device of claim 21, wherein the transparent region of the non-display region of the first display panel is disposed over the display region of the second display panel so that the first display panel is closer to a user than the second display panel.

23. The multi display device of claim 21, further comprising a third display panel including a display region and a non-display region at a periphery of the display region,
wherein the transparent region of the non-display region of the second display panel overlaps a portion of the display region of the third display panel.

24. The multi display device of claim 23, wherein a portion of the non-display region of the third display panel includes a transparent region.

25. The multi display device of claim 21, wherein the first display panel is an OLED display panel and the second display panel is a liquid crystal display (LCD) panel.

26. The multi display device of claim 21, wherein a first distance between a first end of the transparent region of the non-display region of the first display panel and a first boundary of the display region of the first display panel is equal to or smaller than a distance between a second boundary of the display region of the second display panel and the first end of the transparent region of the non-display region of the first display panel.

27. A display device comprising:
a first display panel and a second display panel, each of the first and second display panels including a display region having pixels used for displaying images, and further including at least one non-display region adjacent to and extending along a periphery of the display region,
wherein the non-display region of the first display panel has an edge with transparent characteristics and dimensions including a width and a thickness that provide an overlapping attachment with a counterpart second display panel such that the display region of the first display panel and a display region of the second display panel have a visually indistinguishable boundary,
wherein a transparent region of the non-display region of the first display panel includes a plurality of conductive lines made of a transparent material,
wherein the first and second display panels include an overlapping portion where a first side of the first display panel is disposed over a second side of the second display panel to overlap the second display panel,
wherein, in the overlapping portion, a distance between an end of the first display panel and a boundary of the display region of the second display panel is greater than a distance between the end of the first display panel and a boundary of the display region of the first display panel,
wherein an image displayed by the display region of the second display panel is displayed through the transparent region of the non-display region of the first display panel,
wherein a width of the non-display region along a second side of the first display panel is different from a width of the transparent region of the non-display region along the first side of the first display panel,
wherein a gate link line connected to a gate driver for transmitting a gate signal is disposed in the transparent region of the non-display region of the first display panel and the gate link line includes a transparent conductive material, and
wherein a data link line connected to a data driver for transmitting a data signal is disposed in the transparent region of the non-display region of the first display panel and the data link line includes a transparent conductive material.

28. The display device of claim 27, wherein the transparent characteristics and the dimensions of the edge of the first display panel allow a portion of the display region of the second display panel, which is attached to the first display panel in an edge overlapping manner that results in the overlapping attachment, to be visible through the non-display region at the edge of the first display panel.

29. The display device of claim 28, wherein the first display panel includes two non-display regions along two edges thereof.

30. The display device of claim 29, wherein the first display panel is attached with a plurality of counterpart display panels according to the overlapping attachment for achieving a tiled display screen having an overall size that is determined by a total number of display panels being attached together.

* * * * *